(12) United States Patent
Zhu

(10) Patent No.: US 10,978,591 B2
(45) Date of Patent: Apr. 13, 2021

(54) NANOWIRE SEMICONDUCTOR DEVICE HAVING HIGH-QUALITY EPITAXIAL LAYER AND METHOD OF MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/060,399

(22) PCT Filed: Jun. 27, 2016

(86) PCT No.: PCT/CN2016/087251
§ 371 (c)(1),
(2) Date: Jun. 7, 2018

(87) PCT Pub. No.: WO2017/096781
PCT Pub. Date: Jun. 15, 2017

(65) Prior Publication Data
US 2018/0277682 A1    Sep. 27, 2018

(30) Foreign Application Priority Data

Dec. 7, 2015 (CN) .......................... 201510888321.4
Jun. 17, 2016 (CN) .......................... 201610440133.X

(51) Int. Cl.
*H01L 29/78* (2006.01)
*H01L 29/06* (2006.01)
(Continued)

(52) U.S. Cl.
CPC .......... *H01L 29/7853* (2013.01); *B82Y 10/00* (2013.01); *H01L 29/068* (2013.01);
(Continued)

(58) Field of Classification Search
CPC ........... H01L 29/0692; H01L 29/66553; H01L 29/6653; H01L 29/7853; H01L 29/068;
(Continued)

(56) References Cited

U.S. PATENT DOCUMENTS

2007/0029586 A1    2/2007  Orlowski
2008/0150165 A1*   6/2008  Stumbo ............... H01L 29/0665
                                                           257/784

(Continued)

FOREIGN PATENT DOCUMENTS

CN    101339947    1/2009
CN    103456638    12/2013
(Continued)

OTHER PUBLICATIONS

U.S. Patent Office Action dated Jan. 11, 2019 for U.S. Appl. No. 15/371,431.
(Continued)

*Primary Examiner* — Thanh T Nguyen
(74) *Attorney, Agent, or Firm* — Christensen, Fonder, Dardi & Herbert PLLC

(57) ABSTRACT

A nanowire semiconductor device having a high-quality epitaxial layer. The semiconductor device may include: a substrate; one or more nanowires spaced apart from the substrate, wherein the nanowires each extend along a curved longitudinal extending direction; and one or more semiconductor layers formed around peripheries of the respective nanowires to at least partially surround the respective
(Continued)

nanowires, wherein the respective semiconductor layers around the respective nanowires are spaced apart from each other.

25 Claims, 16 Drawing Sheets

(51) Int. Cl.
  *H01L 29/423* (2006.01)
  *H01L 29/775* (2006.01)
  *B82Y 10/00* (2011.01)
  *H01L 29/66* (2006.01)
  *H01L 29/786* (2006.01)
  *H01L 21/02* (2006.01)
  *H01L 29/165* (2006.01)
  *H01L 29/267* (2006.01)

(52) U.S. Cl.
  CPC ...... *H01L 29/0649* (2013.01); *H01L 29/0673* (2013.01); *H01L 29/0692* (2013.01); *H01L 29/42376* (2013.01); *H01L 29/42392* (2013.01); *H01L 29/6653* (2013.01); *H01L 29/6681* (2013.01); *H01L 29/66439* (2013.01); *H01L 29/66553* (2013.01); *H01L 29/775* (2013.01); *H01L 29/78696* (2013.01); *H01L 21/02639* (2013.01); *H01L 29/165* (2013.01); *H01L 29/267* (2013.01)

(58) Field of Classification Search
  CPC ........... H01L 29/0673; H01L 29/78696; H01L 29/775; H01L 29/42376; H01L 29/42392; H01L 29/66439; H01L 29/0649; H01L 29/6681; H01L 21/02639; H01L 29/165; H01L 29/267; B82Y 10/10
  See application file for complete search history.

(56) References Cited

U.S. PATENT DOCUMENTS

| 2008/0164535 | A1 | 7/2008 | Chidambarrao et al. |
| 2011/0073842 | A1 | 3/2011 | Liu et al. |
| 2013/0279145 | A1* | 10/2013 | Then ................. H01L 29/66431 361/820 |
| 2014/0051213 | A1* | 2/2014 | Chang .................... B82Y 10/00 438/151 |
| 2014/0225065 | A1 | 8/2014 | Rachmady et al. |
| 2015/0035071 | A1 | 2/2015 | Ching et al. |
| 2015/0104918 | A1* | 4/2015 | Liu .................... H01L 29/42392 438/283 |
| 2016/0172359 | A1 | 6/2016 | Yoon et al. |

FOREIGN PATENT DOCUMENTS

| CN | 104011868 | 8/2014 |
| CN | 104584189 | 4/2015 |
| CN | 105633166 | 6/2016 |
| CN | 105633167 | 6/2016 |
| WO | WO2015047354 | 4/2015 |

OTHER PUBLICATIONS

Chinese Office Action dated Jan. 4, 2019 for Chinese Patent Application No. 201510888321.4.
Chinese Office Action dated Dec. 18, 2018 for Chinese Patent Application No. 201610440133.X.
U.S. Patent Office Action dated Dec. 10, 2020 for U.S. Appl. No. 16/586,697.

* cited by examiner

US 10,978,591 B2

NANOWIRE SEMICONDUCTOR DEVICE HAVING HIGH-QUALITY EPITAXIAL LAYER AND METHOD OF MANUFACTURING THE SAME

CROSS-REFERENCE TO RELATED APPLICATIONS

This application is a national stage filing of PCT Application Number PCT/CN2016/087251, filed Jun. 27, 2016, which claims priority to Chinese Patent Application No. 201610440133.X, filed on Jun. 17, 2016, entitled "NANOWIRE SEMICONDUCTOR DEVICE HAVING HIGH-QUALITY EPITAXIAL LAYER AND METHOD OF MANUFACTURING THE SAME," which are incorporated herein by reference in their entireties.

TECHNICAL FIELD

The present disclosure relates to the field of semiconductors, and more particularly, to a nanowire semiconductor device having a high-quality epitaxial layer and a method of manufacturing the same.

BACKGROUND

With the development of semiconductor devices, it is desirable to manufacture high-performance semiconductor devices such as Metal-Oxide-Semiconductor Field-Effect Transistors (MOSFETs) with a semiconductor material of higher mobility than that of silicon (Si). However, it is difficult to form a high-quality semiconductor material of high mobility.

SUMMARY

In view of the above, the present disclosure aims to provide, among others, a semiconductor device having a high-quality epitaxial layer and a method of manufacturing the same.

According to an aspect of the present disclosure, there is provided a semiconductor device, comprising: a substrate; one or more nanowires spaced apart from the substrate, wherein the nanowires each extend along a curved longitudinal extending direction; and one or more semiconductor layers formed around peripheries of the respective nanowires to at least partially surround the respective nanowires, wherein the respective semiconductor layers around the respective nanowires are spaced apart from each other.

According to another aspect of the present disclosure, there is provided a semiconductor device, comprising: a substrate; and at least two nanowires spaced apart from the substrate, wherein the nanowires are arranged in a direction substantially perpendicular to a surface of the substrate, and the respective nanowires are spaced apart from one another and extend along a curved longitudinal extending direction substantially in parallel to each other, wherein at least one pair of adjacent ones of the nanowires are mirror-symmetrical in crystal structure with respect to a central line therebetween.

According to a further aspect of the present disclosure, there is provided a method of manufacturing a semiconductor device, comprising: forming, on a substrate, a fin-shaped structure extending along a curved longitudinal extending direction; forming a supporting portion on the substrate with the fin-shaped structure formed thereon; removing a portion of the fin-shaped structure to form at least one nanowire spaced apart from the substrate, wherein the at least one nanowire is supported by the supporting portion; and growing a semiconductor layer or semiconductor layers respectively with each of the at least one nanowire as a seed layer.

According to yet another aspect of the present disclosure, there is provided a method of manufacturing a semiconductor device, comprising: forming, on a substrate, a fin-shaped structure extending along a curved longitudinal extending direction; forming a supporting portion on the substrate with the fin-shaped structure formed thereon; removing a portion of the fin-shaped structure to form at least one nanowire spaced apart from the substrate, wherein the at least one nanowire is supported by the supporting portion; growing a semiconductor layer or semiconductor layers respectively with each of the at least one nanowire as a seed layer; forming a mask layer between one of the semiconductor layer(s) which is closest to the substrate and the substrate and between the respective semiconductor layers; selectively etching the respective semiconductor layer(s) with the nanowire(s) and the mask layer as a mask, so that the semiconductor layer(s) is/are remained between the nanowire(s) and the mask layer; and selectively removing the nanowire(s) and the mask layer.

According to embodiments of the present disclosure, the semiconductor layer can be grown with the curved nanowire suspended relative to the substrate as a seed layer, and the semiconductor layer can have high mobility. Such a suspended seed layer can enable relaxation of stresses in the nanowire and the semiconductor layer, thereby contributing to suppress defects in the nanowire or the semiconductor layer.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1A:
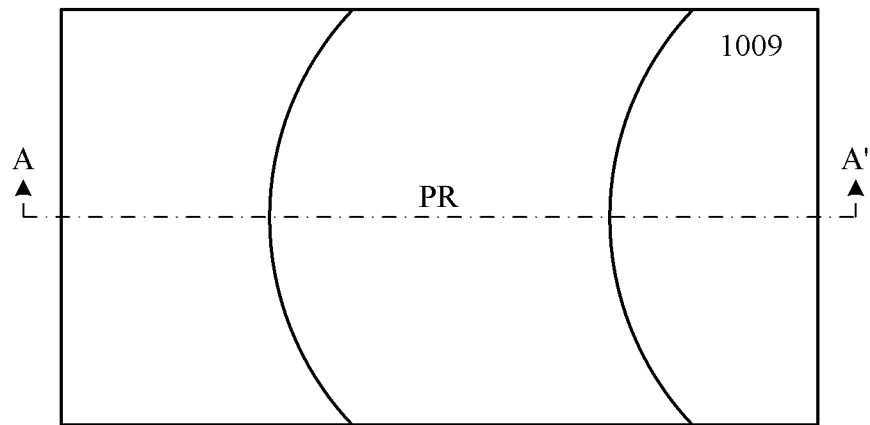
FIGS. 1(a)-15 are schematic views showing a flow of manufacturing a semiconductor device according to an embodiment of the present disclosure.

Hereinafter, embodiments of the present disclosure will be described with reference to the attached drawings. However, it should be understood that those descriptions are provided for illustrative purpose only, rather than limiting the scope of the present disclosure. Further, in the following, descriptions of known structures and techniques might be omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a semiconductor device having a suspended fin structure. Here, the so-called "fin structure" refers to a structure protruding with respect to a surface of a substrate, including, but not limited to, a fin in a Fin Field Effect Transistor (FinFET); and the so-called "suspended" refers to that the fin is spaced apart from the substrate. It is to be noted that a spacing between the fin and the substrate may be filled with another material (for example, an isolation layer). The fin may comprise a semiconductor material of high mobility, to improve performances of the device. Here, the so-called "high mobility" refers to higher mobility than that of silicon (Si). The semiconductor material of high mobility comprises, for example, Ge, SiGe, a III-V compound semiconductor, or the like.

The fin may be a semiconductor layer formed (for example, epitaxially grown) on a nanowire above and spaced apart from the substrate. Here, the so-called "nanowire" refers to a wire-like structure having a length in a longitudinal extending direction thereof much greater than a cross-sectional dimension thereof, which is in an order of nanometer. The nanowire may be in a fin shape which extends in a curved longitudinal extending direction (for example, substantially in a "C" or "S" shape) and is suspended relative to the substrate, for example, substantially in parallel to the surface of the substrate. Then, the semiconductor layer may be formed to at least partially surround a periphery of the nanowire, so that the semiconductor layer extends in substantially the same direction as the nanowire (and thereby is also in a fin shape) and can then be used as the fin of the device. Here, the so-called "partially surround(ing)" refers to that there may be an extent of the nanowire in the longitudinal extending direction thereof in which the semiconductor layer can completely enclose an external surface of the nanowire. That is, in this extent, the semiconductor layer may form a closed pattern in a cross section perpendicular to the longitudinal extending direction of the nanowire (for example, a rectangle, a polygon or the like corresponding to a shape of the cross section of the nanowire). Of course, the nanowire may have its surface, other than those covered by a supporting portion, covered by the semiconductor layer. The nanowire may be relatively thin (for example, with a thickness of about 3-20 nm) and is suspended relative to the substrate. In this way, stresses in the nanowire and the semiconductor layer can be relaxed in the growth process, and therefore it is possible to suppress or avoid defects occurring in the nanowire or the semiconductor layer.

Alternatively, the fin may be a portion of the semiconductor layer formed as above which is positioned on upper and/or lower sides of the nanowire. The remaining portions of the semiconductor layer, for example, those positioned on left and right sides of the nanowire and also the nanowire may be removed. In this way, the fin itself is in a form of nanowire and extends substantially in the same shape as the nanowire which is a seed layer. For a semiconductor layer grown with the same nanowire as a seed, its portion positioned on the upper side of the nanowire and its portion positioned on the lower side of the nanowire are grown from upper and lower surfaces of the nanowire respectively, and therefore their crystal structures may be substantially mirror-symmetrical with respect to a center therebetween.

The nanowire may be physically connected to the substrate through the supporting portion and thus is supported by the substrate. The nanowire has a portion connected to the supporting portion, which portion may have an extent, in the longitudinal extending direction of the nanowire, less than a length of the nanowire in the longitudinal extending direction. In this way, when only a positional relationship among the nanowire, the substrate and the supporting portion is observed (without considering other layer structures), the nanowire is similar to a cantilever, and the supporting portion is similar to an anchor of the cantilever.

The supporting portion may comprise a laterally extending portion extending along the surface of the substrate and a vertically extending portion extending in a direction substantially perpendicular to the surface of the substrate, wherein the vertically extending portion extends onto vertical sidewalls of the nanowire which are substantially perpendicular to the surface of the substrate. In this way, the nanowire is physically connected to the substrate via the supporting portion and thus is supported by the substrate. The vertically extending portion of the supporting portion may extend on the vertical sidewalls on opposite sides of the nanowire to sandwich the nanowire.

The supporting portion may be positioned at opposite ends of the nanowire.

In a case of a field effect transistor, the substrate may have an isolation layer formed thereon to electrically isolate a gate stack of the field effect transistor from the substrate. The isolation layer may have a top surface closer to the substrate than a bottom surface of the lowest semiconductor layer/nanowire facing the substrate, so as to expose the respective semiconductor layers/nanowires. In this way, the gate stack may surround the respective semiconductor layers/nanowires (i.e., fins of the device).

According to an embodiment, a plurality of devices may be formed based on one same fin (semiconductor layer/nanowire). For example, devices may be respectively formed based on different portions of the fin along the longitudinal extending direction thereof. In a case of a field effect transistor, there may be more than one, for example, two or more, gate stacks intersecting the same fin, to form corresponding devices respectively. For example, the gate stack may comprise a first gate stack and a second gate stack which are spaced apart from each other in the longitudinal extending direction of the fin. The first gate stack may intersect a first portion of the fin in the longitudinal extending direction (i.e., a portion of the semiconductor layer surrounding a periphery of a first portion of the nanowire along the longitudinal extending direction thereof or a nanowire formed therefrom), and the second gate stack may intersect a second portion of the fin in the longitudinal extending direction (i.e., a portion of the semiconductor layer surrounding a periphery of a second portion of the nanowire along the longitudinal extension or a nanowire formed therefrom). Devices corresponding to the first gate stack and the second gate stack may be spaced apart from each other. For example, a dielectric layer may be formed to separate the first portion and the second portion of the nanowire as a seed layer. The dielectric layer may extend in a direction intersecting the longitudinal extending direction of the nanowire, and may further separate different portions of the semiconductor layer/nanowire grown based on the seed layer.

Such a semiconductor device can be manufactured, for example, as follows. Specifically, a fin-shaped structure, which is curved (for example, substantially "C"-shaped or "S"-shaped) along its longitudinal extending direction, may be formed on the substrate. After that, a portion of the fin structure may be removed to obtain at least one nanowire spaced apart from the substrate, which may be suspended relative to the substrate.

In order to support the nanowire which is to be suspended, a supporting portion may be formed. This supporting portion may be formed as follows. Specifically, a film material (which is referred to as a supporting layer below) may be formed on the substrate with the fin-shaped structure formed thereon, and then the supporting layer is patterned into the supporting portion which extends from the surface of the substrate to a surface of the fin-shaped structure and therefore physically connects the fin-shaped structure to the substrate. The supporting layer may be patterned with a mask. The mask extends on the fin-shaped structure beyond an extent of the fin-shaped structure in a direction perpendicular to the longitudinal extending direction of the fin-shaped structure (in this way, the mask can shield portions of the supporting layer extending on the surface of the substrate on opposite sides of the fin structure, so that those portions can then be remained); and the mask covers only a fraction of a length of the fin-shaped structure in the longitudinal extending direction (in this way, the mask shields only a fraction of the longitudinal extent of the fin structure, so that this portion can then be connected to the supporting portion). The mask may cover opposite ends of the fin-shaped structure, and accordingly the resulting supporting portion may be positioned at the opposite ends of the fin-shaped structure.

After that, a portion of the fin-shaped structure may be removed to obtain the nanowire. For example, the fin-shaped structure may be divided into a number of portions in a direction substantially perpendicular to the surface of the substrate, and those portions extend along the longitudinal extending direction of the fin-shaped structure, respectively. One or more nanowires may be obtained by removing some of those portions while leaving the remaining portions. Thus, these nanowires may be arranged in the direction substantially perpendicular to the surface of the substrate, and the respective nanowires are spaced apart from each other and extend substantially in parallel to each other. In this way, the nanowire is similar to a cantilever relative to the substrate, and the supporting portion is similar to an anchor of the cantilever to anchor the nanowire as a cantilever to the substrate.

In order to facilitate removal the portion of the fin-shaped structure, the fin-shaped structure may comprise a stack of sacrificial layer(s) and nanowire material layer(s) alternatively formed on the substrate. For example, the sacrificial layer(s) and the nanowire material layer(s) may be formed alternatively on the substrate, and then patterned into the fin-shaped structure. The patterning step may be carried out into the substrate, so that a protrusion may be formed on the substrate at a position corresponding to the fin-shaped structure. Then, the sacrificial layer(s) may be selectively removed.

As the nanowire is suspended and thereby surfaces thereof are exposed, a semiconductor layer may be grown on the surfaces. Then, in a case of sufficient growth, all the surfaces of the nanowire (exposed by the supporting portion) may be covered by the semiconductor layer. This semiconductor layer may then act as a fin of the device.

Alternatively, a mask layer may also be formed between one of the semiconductor layers closest to the substrate and the substrate and also between the respective semiconductor layers. Thus, the respective semiconductor layers may be selectively etched with the nanowires and the mask layer as a mask so that the semiconductor layers are remained between the nanowires and the mask layer. Then, the nanowires and the mask layer may be selectively removed. The remaining portions of the semiconductor layer may be in substantially the same shape as that of the nanowire and may then act as a fin of the device.

There are various ways to manufacture the device based on the fin. For example, an isolation layer may be formed on the substrate, and a gate stack intersecting the semiconductor layer(s) may be formed on the isolation layer. The isolation layer may have a top surface lower than the lowest bottom surface of the semiconductor layer(s), and therefore the respective semiconductor layers are exposed by the isolation layer. The isolation layer may be obtained by depositing a dielectric such as oxide and then etching it back. The supporting portion may have a material different from that of the isolation layer so that the supporting portion may not be attacked in the back-etching process.

In addition, in forming the gate stack, as described above, two or more gate stacks intersecting one same fin may be formed to result in corresponding devices respectively. Isolation may be formed between the respective devices according to design requirements. For example, a dielectric layer extending in a direction intersecting the longitudinal extending direction of the nanowire may be formed on the isolation layer, and the dielectric layer may divide the nanowire into a first portion and a second portion, and may divide the semiconductor layer/nanowire grown on the nanowire into a first portion and a second portion. The gate stack may be formed to include a first gate stack intersecting the first portion of the grown semiconductor layer/nanowire and a second gate stack intersecting the second portion of the grown semiconductor layer/nanowire.

The present disclosure may be implemented in various forms, and some examples thereof will be described below.

Figure 1B:
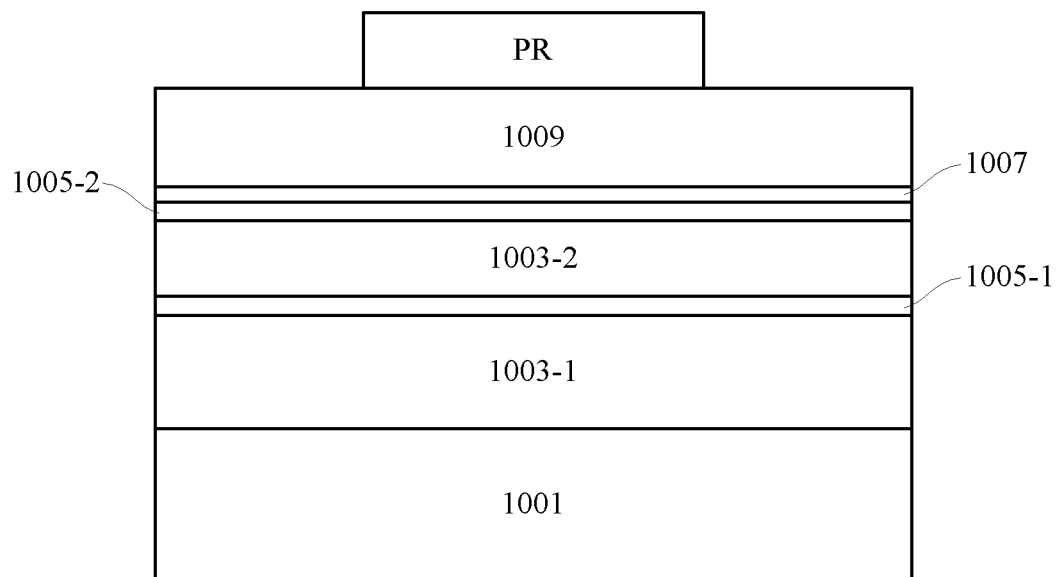

As shown in FIGS. 1(a) and 1(b) (FIG. 1(a) is a top view, and FIG. 1(b) is a sectional view along line AA' in FIG. 1(a)), a substrate 1001 is provided. The substrate 1001 may be a substrate in any form, for example, but not limited to, a bulk semiconductor substrate such as a bulk Si substrate or the like. Hereinafter, the bulk Si substrate will be described by way of example for convenience of description.

A sacrificial layer 1003-1, a nanowire material layer 1005-1, a sacrificial layer 1003-2 and a nanowire material layer 1005-2 are formed in sequence on the substrate 1001 by, for example, epitaxy. The sacrificial layers 1003-1 and 1003-2 may include a different semiconductor material from those of the substrate 1001 and the nanowire material layers 1005-1 and 1005-2, for example, SiGe (wherein Ge may have an atomic percentage of, for example, about 5-20%). The sacrificial layer 1003-1 may have a thickness of about 10-100 nm, and the sacrificial layer 1003-2 may have a thickness of about 10-50 nm (the thickness of these sacrificial layers may be determined according to a distance between nanowires to be obtained and the substrate and a spacing between adjacent ones of the nanowires). The nanowire material layers 1005-1 and 1005-2 may include a suitable semiconductor material, such as Si, with a thickness of about 3-10 nm (the thickness of the nanowire material layers may be determined according to a height of the nanowire to be obtained). Of course, the present disclosure is not limited to a specific number of the sacrificial layers and the nanowire material layers, but may include more or less sacrificial layers or nanowire material layers as long as they are alternately stacked on the substrate.

Then, the nanowire layers and the sacrificial layers (and optionally, the substrate) which are formed in such a way may be patterned to form a fin-shaped structure. For example, this can be done as follows.

Specifically, a hard mask layer may be formed on the nanowire material layer 1005-2. In this example, the hard mask layer may comprise an oxide (for example, silicon oxide) layer 1007 and a polysilicon layer 1009. For example, the oxide layer 1007 has a thickness of about 2-10 nm, and the polysilicon layer 1009 has a thickness of about 50-120 nm. In this example, the hard mask is patterned into a fin-like shape using the pattern transfer technology. To this end, patterned (for example, through exposure and development) photoresist PR may be formed on the hard mask layer. Here, the photoresist PR is patterned into a strip extending in a curved form, and may have a width (a dimension in a horizontal direction in the figure) substantially corresponding to a spacing between two fin-shaped structures. The curved shape may be an arc shape, an arcuate shape, a polynomial curve, a combination thereof, or the like. In this example, the photoresist PR is patterned to be substantially "C" shaped.

Figure 2:
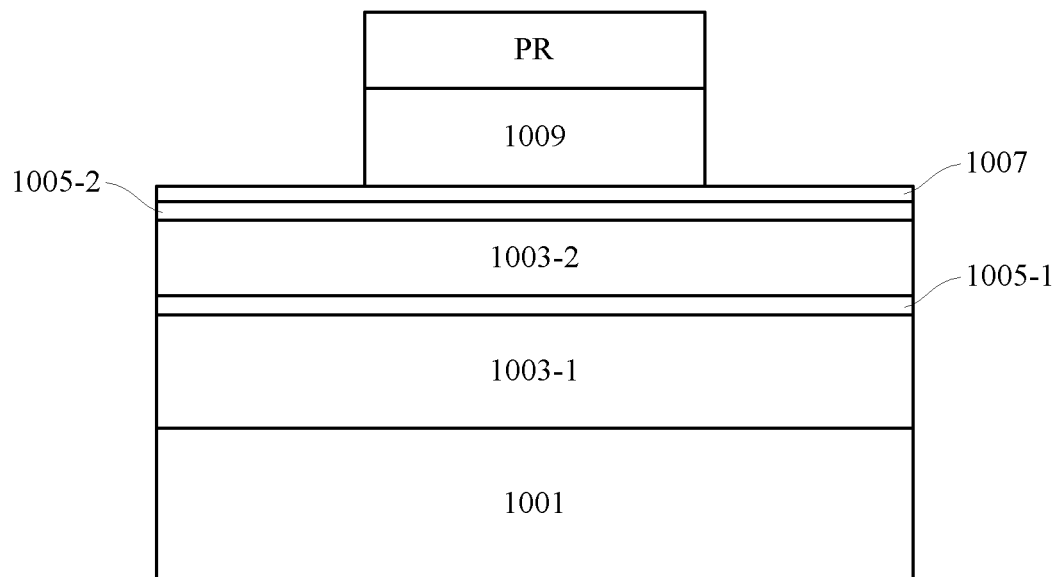
Figure 3A:
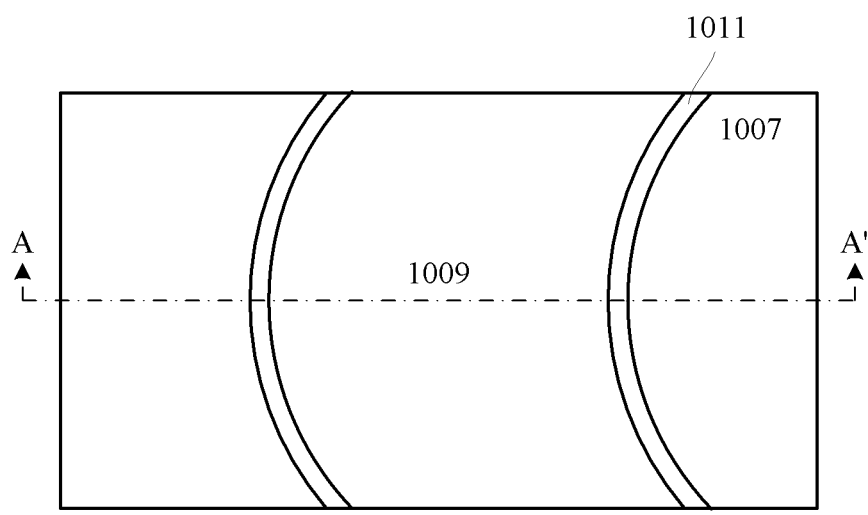
Figure 3B:
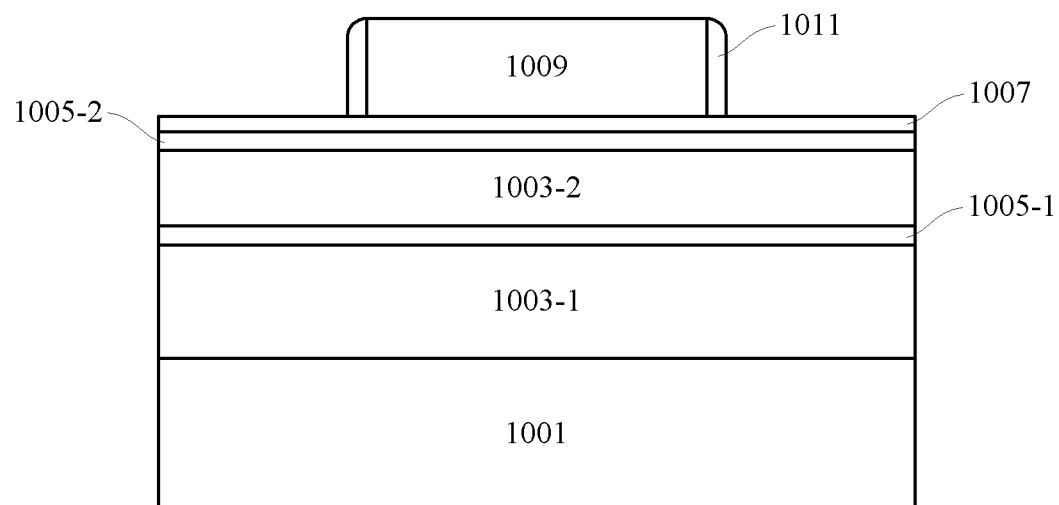
Figure 4:
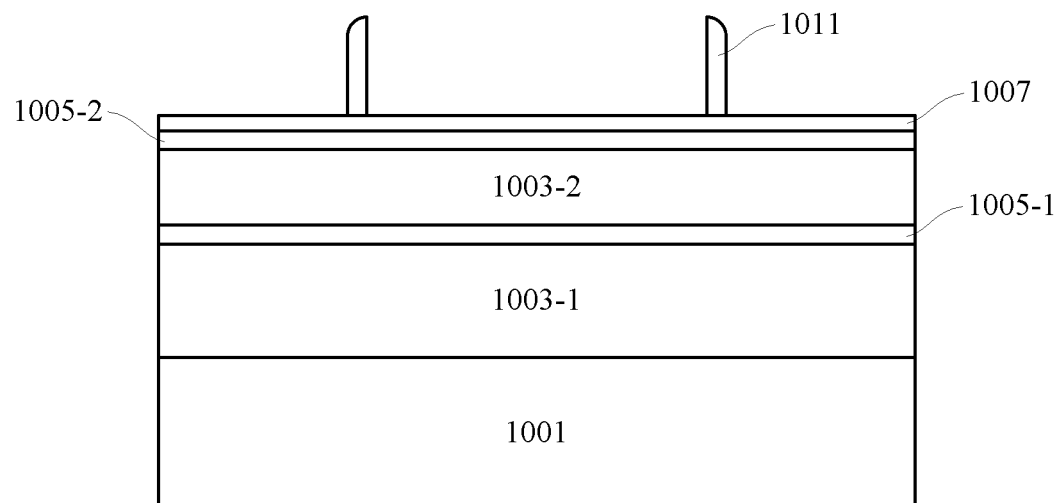

Next, as shown in FIG. 2, the polysilicon layer 1009 is selectively etched (relative to the oxide layer 1007) by, for example, Reactive Ion Etching (RIE) with the photoresist PR as a mask. In this way, the polysilicon layer 1009 may be patterned into a strip corresponding to the photoresist PR. Then, as shown in FIGS. 3(a) and 3(b) (FIG. 3(a) is a top view, and FIG. 3(b) is a sectional view along line AA' in FIG. 3(a)), the photoresist PR is removed and a spacer 1011 is formed on sidewalls of the polysilicon layer 1009. There are various ways in the art to form the spacer. For example, a nitride (for example, silicon nitride) layer with a thickness of, for example, about 3-10 nm may be deposited in a substantially conformal way by, for example, Atomic Layer Deposition (ALD), and then the deposited nitride layer may be selectively etched by, for example, RIE, to remove a laterally extending portion thereof so that a vertically extending portion thereof is remained to form the spacer 1011. The spacer 1011 covers the sidewalls of the polysilicon layer 1009. Then, as shown in FIG. 4 (corresponding to the sectional view in FIG. 3(b)), the polysilicon layer 1009 may be selectively removed (for example, by TMAH solution).

It is to be noted that although not shown in FIG. 3(a), the spacer 1011 may also exist on upper and lower sidewalls of the strip-shaped polysilicon layer 1009, and thereby the spacer 1011 forms a closed pattern surrounding a periphery of the strip-shaped polysilicon layer 1009. The upper and lower portions of the spacer 1011 may be removed by, for example, photolithography, so that the spacer 1011 which is originally in the closed pattern can be separated into two portions. Each of the portions corresponds to a fin-shaped structure to be formed, which in this example constitutes a corresponding one of the two "C"-shaped strips as shown in FIG. 3(a).

Figure 5:
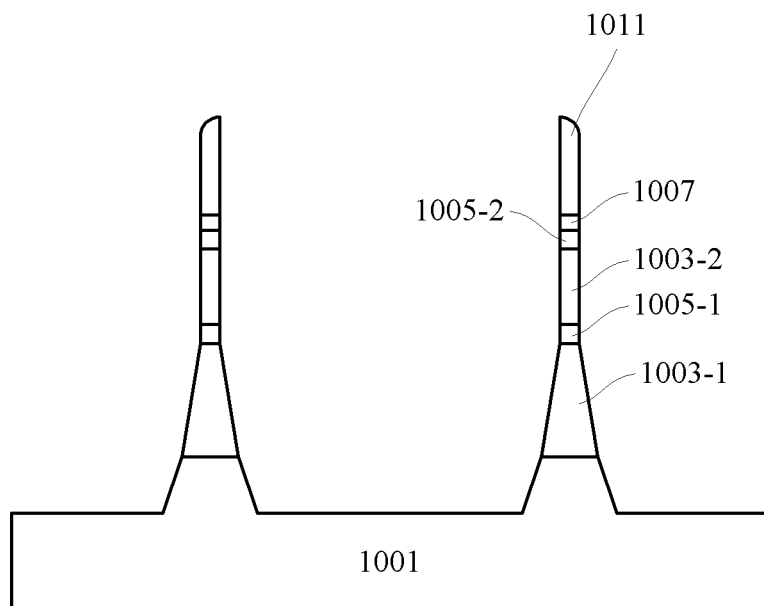
Figure 6:
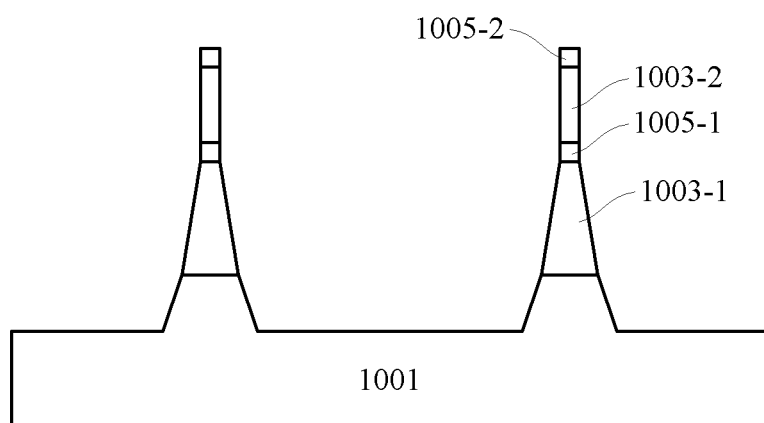

Then, as shown in FIG. 5, the oxide layer 1007, the nanowire material layer 1005-2, the sacrificial layer 1003-2, the nanowire material layer 1005-1, and the sacrificial layer 1003-1 may be selectively etched in sequence by, for example, RIE, with the spacer 1011 as a mask. In this way, the pattern of the spacer 1011 is transferred into the underlying layers, resulting in the fin-shaped structures. Therefore, after the etching, the nanowire material layers 1005-1 and 1005-2 has a width (a dimension in a horizontal direction in the figure) which is substantially the same as that of the spacer 1011 (for example, about 3-10 nm). Here, the substrate 1001 may be further selectively etched. Therefore, the substrate 1001 may have a protrusion thereon at a position corresponding to the fin-shaped structure. The fin-shaped structure has a projection on the substrate at substantially the middle of the protrusion. Due to characteristics of etching, the etched sacrificial layer 1003 and the protrusion of the substrate 1001 each may have a shape increasingly enlarged from top down. Then, the spacer 1011 may be selectively removed (and the oxide layer 1007 may be further selectively removed), as shown in FIG. 6.

Although the fin-shaped structure is formed by using the pattern transfer technology as described above, the present disclosure is not limited thereto. For example, fin-shaped photoresist may be formed directly on the nanowire material layer 1005-2, and the nanowire material layers, the sacrificial layers and the substrate 1001 may be selectively etched with the photoresist as a mask to form a fin-shaped structure. Alternatively, fin-shaped photoresist may be formed directly on the hard mask layer, the hard mask layer may be patterned into a fin-like shape by using the photoresist, and the nanowire material layers, the sacrificial layers and the substrate 1001 may be selectively etched in sequence with the fin-shaped hard mask layer to form a fin-shaped structure.

Here, although two fin-shaped structures are illustrated, the present disclosure is not limited thereto. For example, more or less fin-shaped structures may be formed. Further, a layout of the fin-shaped structures may be differently designed according to requirements for the device.

Figure 7:
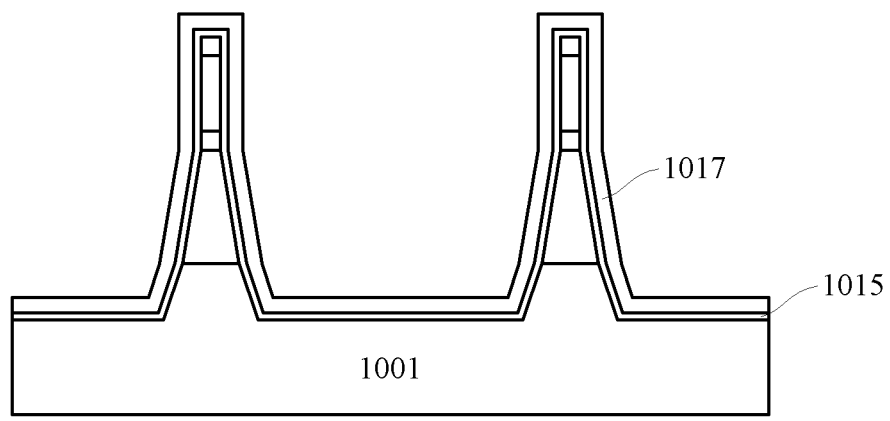

After the fin-shaped structures are formed, a supporting portion may be formed. For example, as shown in FIG. 7, an oxide layer 1015 and a nitride layer 1017 may be formed by, for example, ALD in a substantially conformal way on the substrate with the fin-shaped structures formed thereon. The oxide layer 1015 may have a thickness of about 1-10 nm, and the nitride layer 1017 may have a thickness of about 2-15 nm. Then, as illustrated in the top view of FIG. 8, patterned photoresist 1019 may be formed on the structure illustrated in FIG. 7. The photoresist 1019 is patterned to cover opposite ends (upper and lower ends in the figure) of the fin-shaped structures and extend in a horizontal direction in the figure. It is to be noted here that in the top view of FIG. 8, the topography of the nitride layer 1017 which fluctuates along with the fin-shaped structures on the substrate is not shown merely for convenience, and the same is true for the following top views.

Figure 9A:
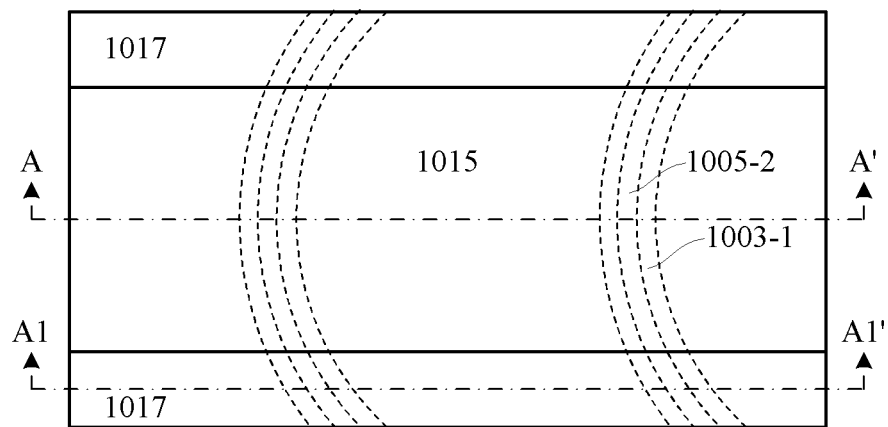
Figure 9B:
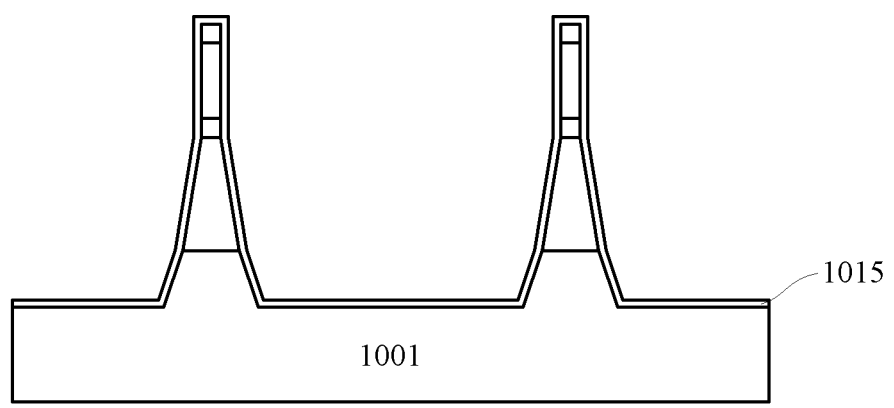
Figure 9C:
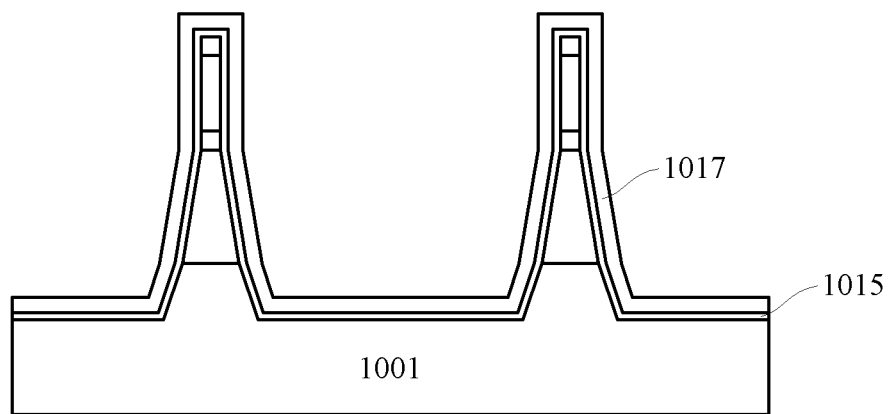

Then, as shown in FIGS. 9(a), 9(b) and 9(c) (FIG. 9(a) is a top view, FIG. 9(b) is a sectional view along line AA' in FIG. 9(a), and FIG. 9(c) is a sectional view along line A1A1' in FIG. 9(a)), the nitride layer 1017 is selectively removed by, for example, RIE (relative to the oxide layer 1015) with the photoresist 1019 as a mask. In this way, as shown in FIG. 9(c), the nitride layer 1017 is remained at opposite ends (upper and lower ends in FIG. 9(a)) of the fin-shaped structures and extends onto the surface of the substrate 1001. In this way, the fin-shaped structures are physically connected to the substrate 1001 by the nitride layer 1017, and thus can be supported by the substrate 1001 (particularly after the sacrificial layers 1003-1 and 1003-2 are removed as described below). Then, the photoresist 1019 may be removed.

In the present embodiment, a supporting layer which is a stack of the oxide layer and the nitride layer is formed, and the supporting layer is patterned into a supporting portion. However, the present disclosure is not limited thereto. The supporting layer may comprise various suitable dielectric materials. In an embodiment in which the supporting portion is subsequently removed, the supporting layer may even comprise a semiconductor material or a conductive material.

It should be noted here that, for convenience of illustration only, the sectional view shown in FIG. 9(c) and the top view shown in FIG. 9(a) are shifted in position (particularly positions of the two fin-shaped structures in FIG. 9(c).) The same is true for the following sectional views.

Figure 10A:
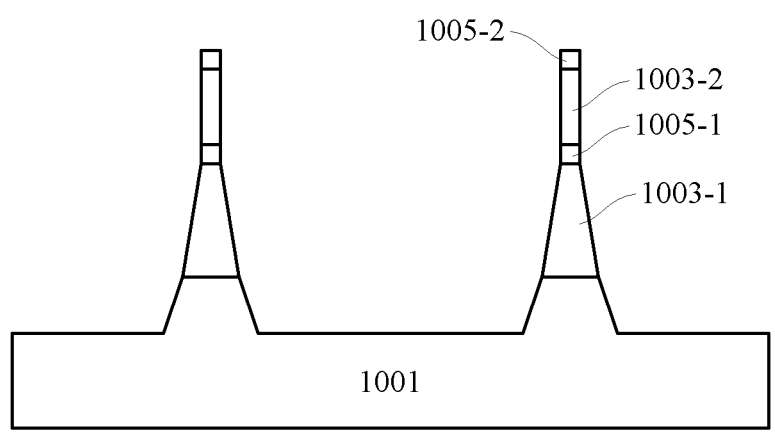
Figure 10B:
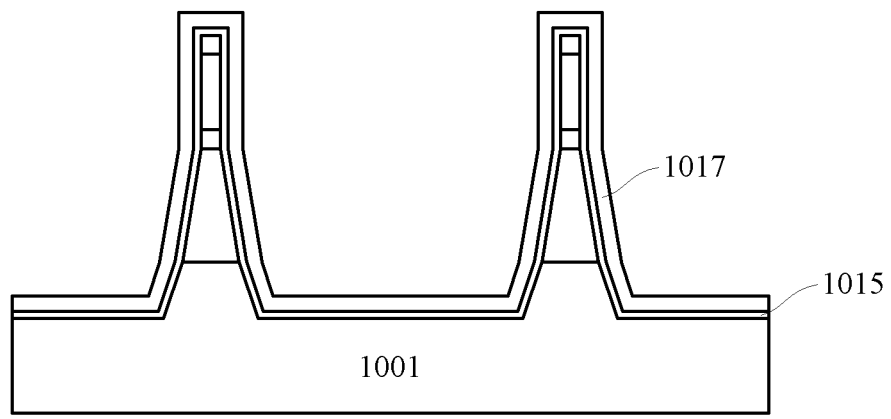
Figure 11A:
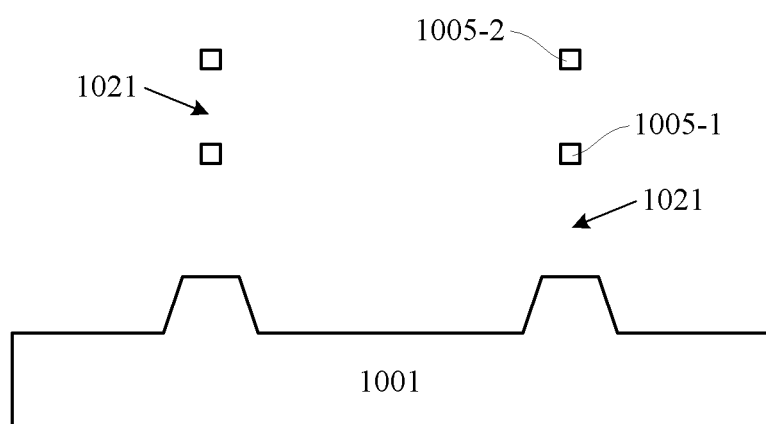
Figure 11B:
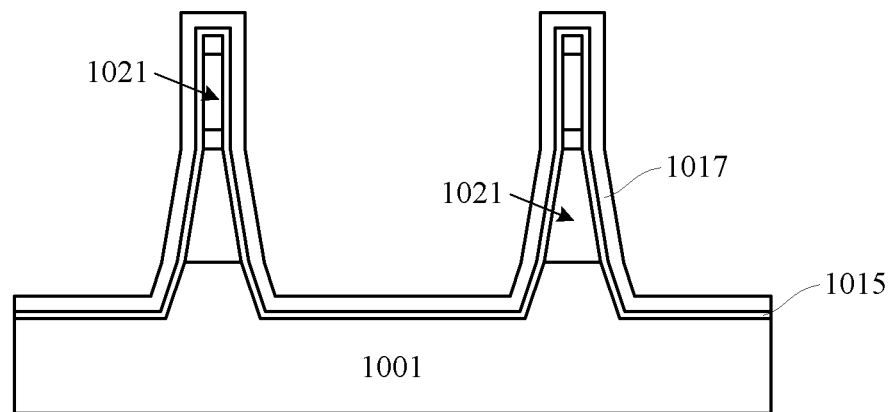

Then, as shown in FIGS. 10(a) and 10(b) (FIG. 10(a) corresponds to the sectional view in FIG. 9(b), and FIG. 10(b) corresponds to the sectional view in FIG. 9(c)), the oxide layer 1015 may be selectively removed by, for example, RIE (relative to the substrate 1001 and the nanowire material layers of Si and the sacrificial layers of SiGe). As shown in FIG. 10(a), the middle of the fin-shaped structure is completely exposed. In addition, as shown in FIG. 10(b), the oxide layer 1015 is covered by the nitride layer 1017 and thus can be remained on the opposite ends of the fin-shaped structure. Then, as shown in FIGS. 11(a) and 11(b) (sectional views corresponding to those of FIGS. 10(a) and 10(b), respectively), the sacrificial layers 1003-1 and 1003-2 may be selectively removed by, for example, wet etching (relative to the substrate 1001 and the nanowire material layers 1005-1 and 1005-2 of Si). In this way, spacing 1021 between the nanowire material layer 1005-1 and the substrate 1001 and between the nanowire material layers 1005-1 and 1005-2 is formed. Thus, the nanowire material layers 1005-1 and 1005-2 constitute nanowire structures, respectively.

As shown in FIGS. 11(a) and 11(b), the nanowires 1005-1 and 1005-2 are spaced apart from the substrate 1001 and are spaced apart from each other by the spacing 1021, extend substantially in parallel to the substrate, and are supported by the substrate 1001 through the supporting portion 1015/1017. The nanowires 1005-1 and 1005-2 may be arranged in a direction substantially perpendicular to the surface of the substrate (in this example, in a substantially vertical direction) and may be aligned with each other. In this example, the nanowires 1005-1 and 1005-2 are substantially in parallel to each other and extend in substantially the same curved longitudinal extending direction.

The supporting portion 1015/1017 comprises a laterally extending portion which extends on the surface of the substrate 1001 and a vertically extending portion which extends in a direction substantially perpendicular to the surface of the substrate. In this example, the vertically extending portion may comprise a portion extending along surfaces of the protrusion of the substrate 1001, a portion extending along surfaces of the sacrificial layers (which have been removed) and also a portion extending along the vertical sidewalls of the nanowires 1005-1 and 1005-2. In this way, the supporting portion 1015/1017 physically connects the nanowires 1005-1 and 1005-2 to the substrate 1001, and thus can support the nanowires 1005-1 and 1005-2. The supporting portion 1015/1017 may extend on the vertical sidewalls of the nanowires 1005-1 and 1005-2 on two opposite sides (left side and right side in the figure), so as to sandwich the respective nanowires, thereby more stably supporting the nanowires. A portion of the nanowire 1005-1 or 1005-2 connected to the supporting portion 1015/1017 has an extent in a longitudinal extending direction of the nanowire 1005-1 or 1005-2 which is less than a length of the nanowire in the longitudinal extending direction. Here, the so-called "longitudinal extending direction" refers to a lengthwise direction of the nanowire (a direction perpendicular to the sheet in FIG. 11), which is substantially the same as a length direction of a channel which is then formed, that is, a direction from a source to a drain, and vice versa. In this way, the nanowires 1005-1 and 1005-2 look like a cantilever relative to the substrate 1001, and the cantilever is anchored to the substrate 1001 by the supporting portion 1015/1017.

In the above example, in addition to the nitride layer 1017, the supporting portion further comprises the oxide layer 1015. However, the present disclosure is not limited thereto. For example, in the processes described above in conjunction with FIG. 7, the oxide layer 1015 may not be formed, and instead, the nitride layer 1017 is directly formed. In this way, subsequent processes may also be implemented in the manner described above in conjunction with FIGS. 8-11(b). Of course, the supporting portion may also comprise other dielectric material(s) or a different stack.

In addition, in the above example, the supporting portion is formed at upper and lower ends of the fin-shaped structure. However, the present disclosure is not limited thereto. For example, the supporting portion may be formed in the middle of the fin-shaped structure.

Figure 8:
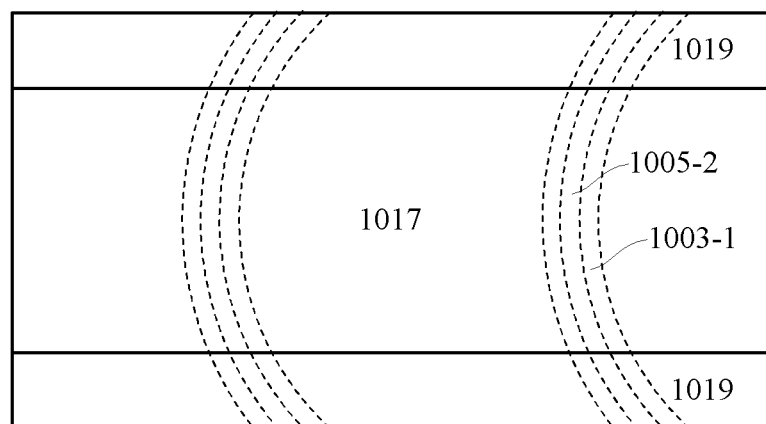

In addition, the mask 1019 which is used to pattern the supporting portion (as shown in FIG. 8) is not limited to the above shape. Generally, the mask may extend on the fin-shaped structure beyond an extent of the fin-shaped structure in a direction perpendicular to the longitudinal extending direction of the fin-shaped structure. In this way, the mask may cover a portion of the nitride layer 1017 extending on the surface of the substrate 1001 (other than the protrusion), and thus this portion can then be remained (as a base of the supporting portion). On the other hand, the mask may cover only a fraction of the length of the fin-shaped structure in the longitudinal extending direction. In this way, a cantilever-anchor like structure may be formed.

Figure 12A:
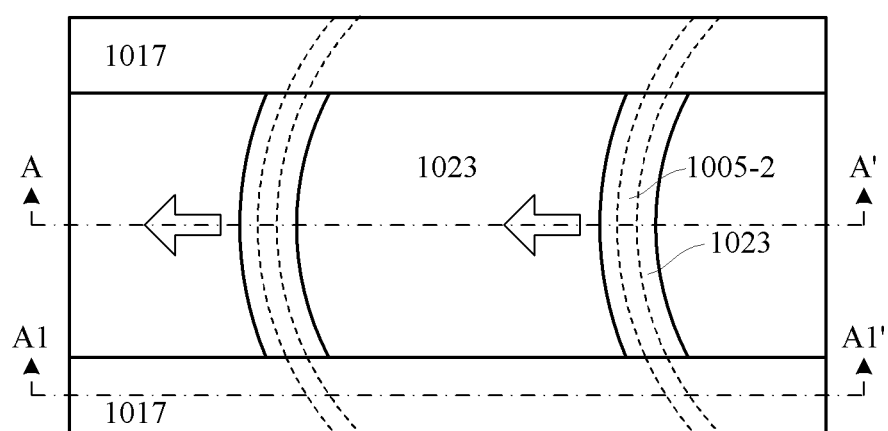
Figure 12B:
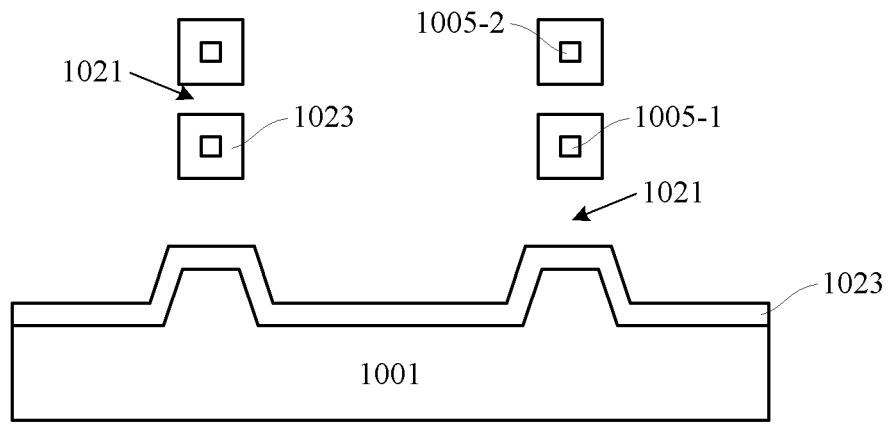
Figure 12C:
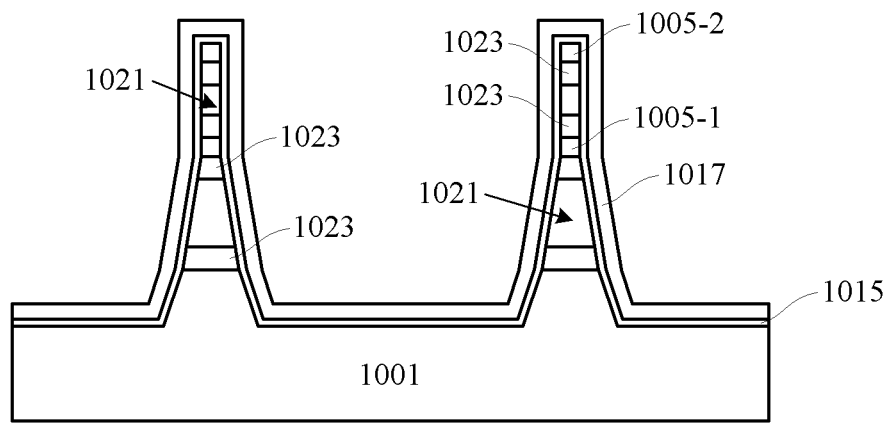

Then, as shown in FIGS. 12(a), 12(b) and 12(c) (FIG. 12(a) is a top view, FIG. 12(b) is a sectional view along line AA' in FIG. 12(a), and FIG. 12(c) is a sectional view along line A1A1' in FIG. 12(a)), a semiconductor layer 1023 may be grown on the nanowires 1005-1 and 1005-2. Here, the semiconductor layer 1023 may comprise a material of high mobility, for example, Ge, SiGe, or a III-V compound semiconductor, such as InSb, InGaSb, InAs, GaAs, InGaAs, AlSb, InP, group-III nitride or the like, with a thickness of about 5-15 nm. In a case of the compound semiconductor such as SiGe, components thereof (for example, an atomic percentage of Ge) may change gradually, so that the compound semiconductor has a lattice constant which changes from being quite similar to that of the nanowires 1005-1 and 1005-2 (here, Si) to being more different from that of the nanowires 1005-1 and 1005-2, to suppress dislocations or defects.

The growth may be selective growth, so that the semiconductor layer 1023 is grown only on the surfaces of the nanowires 1005-1 and 1005-2 (and also the substrate 1001) of the semiconductor material. The growth of the semiconductor layer 1023 may be controlled so that the semiconductor layer 1023 does not completely fill the spacing 1021 between the nanowire 1005-1 and the substrate 1001 and between the nanowires 1005-1 and 1005-2. In addition, as described below, the remaining space 1021 may be sufficient to have a gate dielectric layer (and optionally a work function adjustment layer) formed therein. Due to the suspension configuration of the nanowires 1005-1 and 1005-2, stresses in the nanowires 1005-1 and 1005-2 and the semiconductor layer 1023 can be relaxed in the growth process.

In addition, as shown in FIG. 12(*a*), the semiconductor layer 1023, such as a Ge, SiGe, or III-V compound semiconductor layer, has a lattice constant generally greater than that of silicon, and thus the semiconductor layer 1023 which is grown with the nanowires 1005-1 and 1005-2 of silicon as a seed may increase in length with respect to the nanowires 1005-1 and 1005-2. Thus, as shown by the arrows in the figure, the semiconductor layer 1023 may have its center shifted to the left relative to the original center of the nanowires 1005-1 and 1005-2. This facilitates release of stresses in the growth process.

In this way, it is possible to suppress or even avoid defects occurring in the nanowires 1005-1 and 1005-2 or the semiconductor layer 1023, which contributes to improve performances of the device (for example, reduce an off-state leakage current or increase an on-state current).

In this example, except for surfaces of the nanowires 1005-1 and 1005-2 covered by the supporting portion 1015/1017, remaining surfaces of the nanowires 1005-1 and 1005-2 are covered by the semiconductor layer. Of course, the semiconductor layer 1023 may also be grown on the surface of the substrate 1001.

In this example, the nanowires have a longitudinal extent in the longitudinal extending direction thereof which is not occupied by the supporting portion, and peripheries of which are completely enclosed by the semiconductor layer 1023. In this way, in a cross section (i.e., the cross section illustrated in FIG. 12(*b*)) perpendicular to the longitudinal extending direction of the nanowires, the semiconductor layer 1023 forms a closed pattern (which is a rectangle in this example). Of course, the closed pattern is decided by a pattern of the nanowires in the cross section, and may be in a different shape such as a polygon.

The semiconductor layer 1023 in such a shape may then act as a fin of the device.

After the fin 1023 is formed by the above processes, a gate stack intersecting the fin may be formed, resulting in the final semiconductor device (for example, FinFET).

Figure 13A:
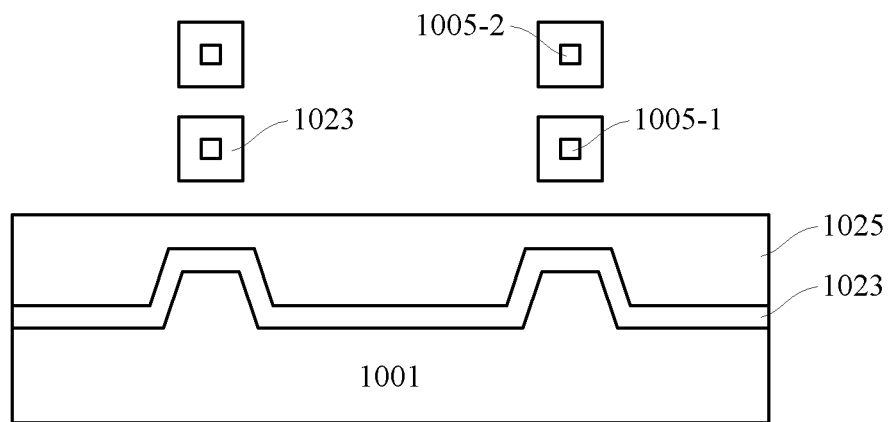
Figure 13B:
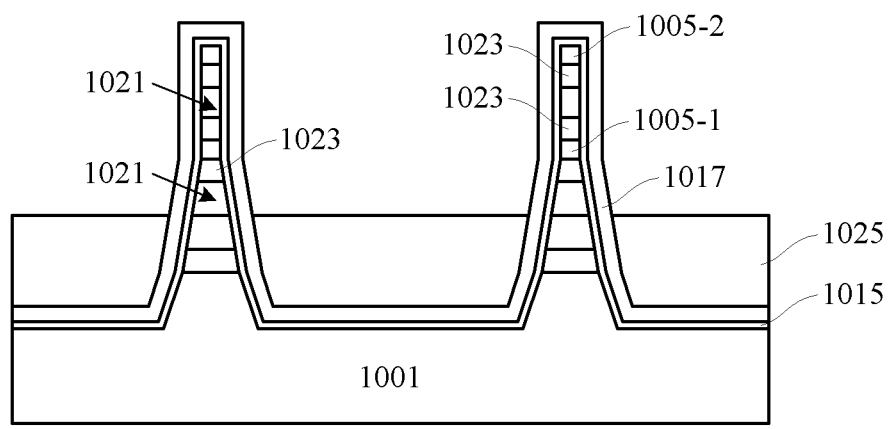

In order to isolate the gate stack from the substrate, as shown in FIGS. 13(*a*) and 13(*b*) (sectional views corresponding to those of FIGS. 12(*b*) and 12(*c*), respectively), an isolation layer 1025 is firstly formed on the substrate 1001 (in this example, on the semiconductor layer 1023 formed on the substrate 1001). This isolation layer may be formed by, for example, depositing a dielectric material such as oxide on the substrate and then etching it back. In the back-etching process, a back-etching depth is controlled so that the resultant isolation layer 1025 can expose the semiconductor layer 1023 which is formed around the respective nanowires.

Figure 14:
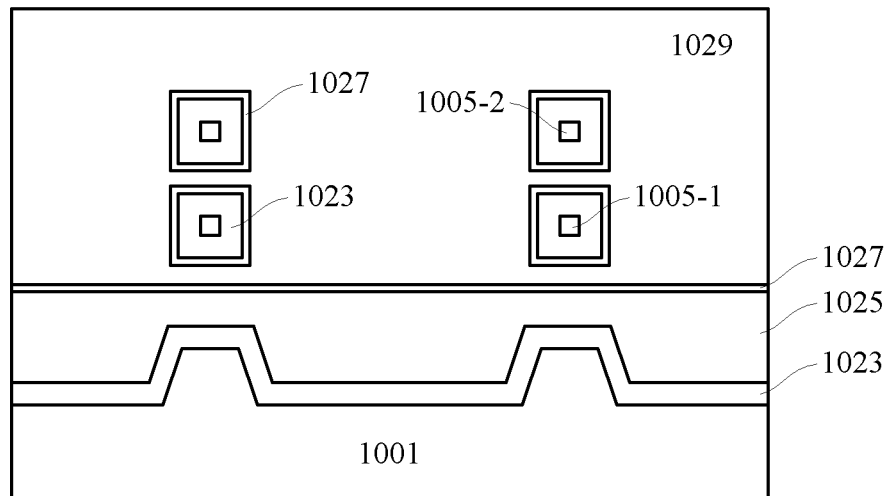

Then, the gate stack intersecting the fin may be formed on the isolation layer 1025. For example, this can be down as follows. Specifically, as shown in FIG. 14 (a sectional view corresponding to that of FIG. 13(*a*)), a gate dielectric layer 1027 and a gate conductor layer 1029 may be formed in sequence. For example, the gate dielectric layer 1027 may comprise oxide (for example, $SiO_2$ or $GeO_2$) with a thickness of about 0.3-2 nm, and the gate conductor layer 1029 may comprise polysilicon. Alternatively, the gate dielectric layer 1027 may comprise a high-K gate dielectric such as $HfO_2$ or $Al_2O_3$ with a thickness of about 1-4 nm, and the gate conductor layer 1029 may comprise a metallic gate conductor. In a case of high-K gate dielectric/metallic gate conductor, a work function adjustment layer (not shown), for example, TiN, Al, Ti, TiAlC, with a thickness of about 1-3 nm may be further formed between the gate dielectric layer 1027 and the gate conductor layer 1029.

Due to the suspended state of the nanowires 1005-1 and 1005-2, the gate dielectric layer 1027 may be formed to at least partially surround the peripheries of the respective nanowires. In addition, the gate dielectric layer may have its material also be formed on a surface of the isolation layer 1025. In addition, in a case of forming the work function adjustment layer, the work function adjustment layer may similarly be formed to at least partially surround the peripheries of the respective gate dielectric layers. In addition, the work function adjustment layer may have its material also be formed on the material of the gate dielectric layer formed on the isolation layer 1025. In a region covered by the supporting portion (as shown in FIG. 13(*b*)), the spacing 1021 therein may also be filled with the materials of the gate dielectric layer, the work function adjustment layer, and the gate conductor layer.

Figure 15:
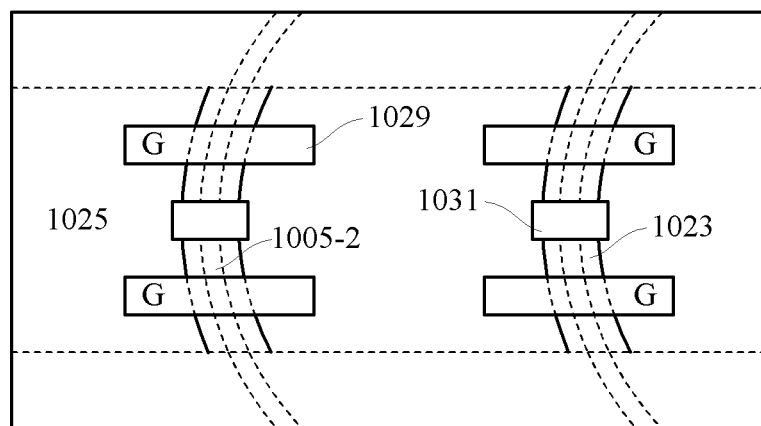

After that, as shown in a top view in FIG. 15, the gate dielectric layer 1027 and the gate conductor layer 1029 may be patterned by, for example, photolithography to form gate stacks G. Here, there are two gate stacks G intersecting one same fin-shaped structure. However, the present disclosure is not limited to this. For example, there may be only one or three or more gate stacks intersecting one same fin-shaped structure. A layout of the gate stack G may depend on the device design.

After the gate stack is formed, halo implantation and extension implantation may be performed with the gate stack as a mask, for example. Next, a gate spacer may be formed on sidewalls of the gate stack. Then, source/drain (S/D) implantation may be performed with the gate stack and the gate spacer as a mask. Then, implanted ions may be activated through annealing to form source/drain regions in the semiconductor layer 1023 at opposite ends (upper and lower ends in the figure) of the gate stack G.

Those skilled in the art are aware of various ways to manufacture a device based on a fin, and processes after formation of the fin will not be described in detail here.

Each gate stack G and a corresponding portion of the fin 1023 form a corresponding device such as a FinFET. Depending on the device design, these devices may be connected to or spaced apart from each other. An example of isolation between the devices is shown in FIG. 15. Specifically, as shown in FIG. 15, a dielectric layer 1031 extending in a direction intersecting the longitudinal extending direction of the fin-shaped structure may be formed on the isolation layer 1025 so as to divide the nanowires 1005-1 and 1005-2 into two isolated portions, and divide the semiconductor layer 1023 into two isolated portions. Specifically, the semiconductor layer 1023 and the nanowires 1005-1 and 1005-2 may be selectively etched by photolithography to form a spacing therein. Then, the spacing is filled with a dielectric material such as oxide to form the dielectric layer 1031.

In this way, the semiconductor device according to the present embodiment is obtained. As shown in FIGS. 14 and 15, the semiconductor device may comprise at least one nanowire (1005-1 and 1005-2) spaced apart from the substrate 1001. The nanowires are physically connected to the substrate 1001 through the supporting portion 1015/1017 (as shown in FIG. 11(*b*)). The semiconductor layer 1023 is formed around the peripheries of the nanowires to act as a fin of the device. In addition, the device also comprises the isolation layer 1025 and the gate stacks (1027 and 1029)

formed on the isolation layer 1025 and intersecting the fin 1023. The gate stacks may at least partially surround the respective fins 1023.

In the present embodiment, in the final device, the supporting portion is remained. However, the present disclosure is not limited thereto. The supporting portion may be selectively (at least partially) removed (for example, after the gate stack is formed), and a space resulting from the removal of the supporting portion may be filled with, for example, another dielectric layer.

In the above embodiment, the supporting portion is formed at opposite ends of the nanowire, and the opposite ends of the curved fin-shaped structure may be fixed, which is particularly advantageous for the curved fin-shaped structure. However, the present disclosure is not limited thereto, and the supporting portion may also be formed at other position(s) of the nanowire in addition to the opposite ends or instead of the opposite ends.

Figure 16:
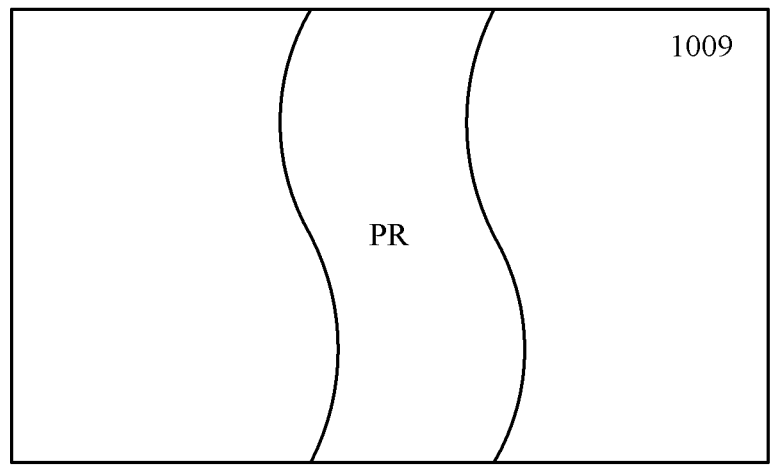
FIGS. 16-17 are schematic views showing some stages in a flow of manufacturing a semiconductor device according to another embodiment of the present disclosure.
Figure 17:
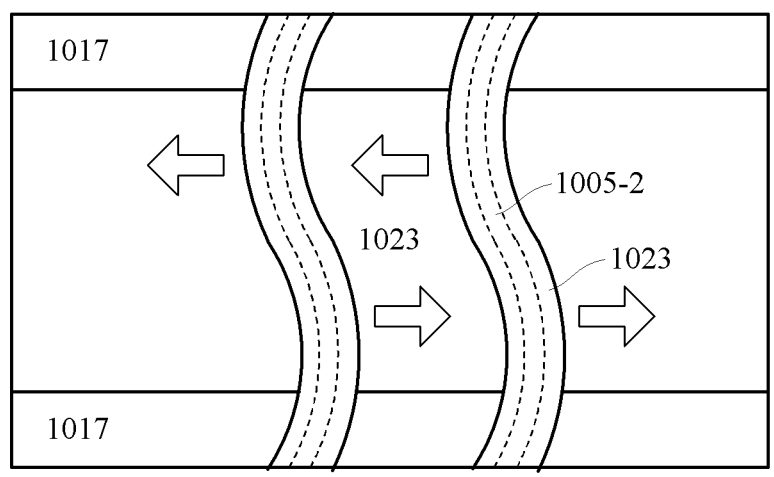

In the above example, the curved fin-shaped structure in substantially a "C" shape is formed. However, the present disclosure is not limited thereto, and various curved shapes such as an arc shape, an arcuate shape, a polynomial curve, or the like or a combination thereof may be formed. For example, as shown in FIG. 16, in the processes described above in connection with FIG. 1(*a*), the photoresist PR may be patterned into substantially a "S" shape rather than substantially a "C" shape. Other processes may be performed as described above. Thus, in the processes described above in connection with FIGS. 12(*a*)-12(*c*), the semiconductor layer 1023 which also extends substantially in an "S" shape may be grown as shown in FIG. 17. The semiconductor layer 1023 may also increase in length relative to the nanowire 1005 as described above. Thus, as shown by the arrows in FIG. 17, the center of the semiconductor layer 1023 may be shifted relative to the original center of the nanowires 1005-1 and 1005-2. This facilitates release of stresses in the growth process. More specifically, the center may be shifted towards a convex side of the curved shape (an upper half of the "S" shape is shifted to the left, and a lower half of the "S" shape is shifted to the right). After that, a gate stack intersecting the "S"-shaped fin 1023 may be formed as described above.

FIGS. 18-22 are schematic views showing some stages in a flow of manufacturing a semiconductor device according to another embodiment of the present disclosure. Hereinafter, the descriptions will focus on the difference between the present embodiment and the embodiments described above.

Firstly, as in the embodiments described above, the nanowires 1005-1 and 1005-2 may be formed on the substrate 1001, and the semiconductor layer 1023 may be grown with the nanowires as a seed, as described above in connection with FIGS. 1-12(*c*). In the present embodiment, the surface of the substrate 1001 may be a (111) crystal plane or a (110) crystal plane. In addition, the uppermost nanowire material layer 1005-2 may be relatively thick, for example, having a thickness of about 3-20 nm, because this layer may later act as a mask.

Because the surface of the substrate 1001 may be a (111) crystal plane or a (110) crystal plane, upper and lower surfaces of the nanowires 1005-1 and 1005-2 (as shown in FIG. 11(*a*)) may also be a (111) crystal plane or a (110) crystal plane, so that the semiconductor layer 1023 can more easily be grown on those two surfaces.

Figure 18:
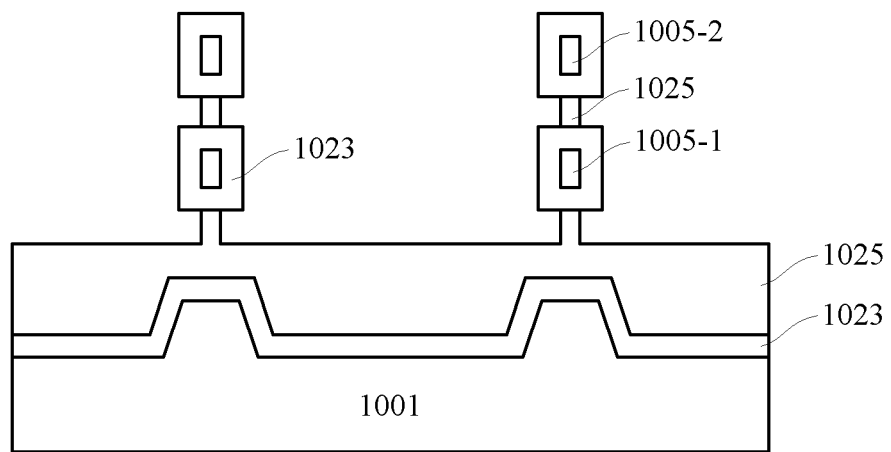
FIGS. 18-22 are schematic views showing some stages in a flow of manufacturing a semiconductor device according to a further embodiment of the present disclosure.

Unlike the processes of forming the isolation layer described in conjunction with FIGS. 13(*a*) and 13(*b*) in the above embodiment, as shown in FIG. 18, in etching back the isolation layer, portions of the isolation layer between the lowest semiconductor layer 1023 and the substrate 1001 and between the respective semiconductor layers 1023 are not completely removed. These remaining portions of the isolation layer 1025 may be realized by, for example, undercutting in the etching, and may be used later as a mask layer. An amount of the etching may be controlled so that the mask layer may have a width substantially the same as that of the nanowires 1005-1 and 1005-2.

It is to be noted here that although the mask layer is formed together with the etching back of the isolation layer, the present disclosure is not limited thereto. For example, the isolation layer may be formed as described in FIGS. 13(*a*) and 13(*b*), and then a dielectric layer (for example, a nitride layer) may be additionally formed on the isolation layer. The nitride layer is selectively etched (and thereby undercuts are formed), which can also yield the mask layer as shown in FIG. 18.

Figure 19:
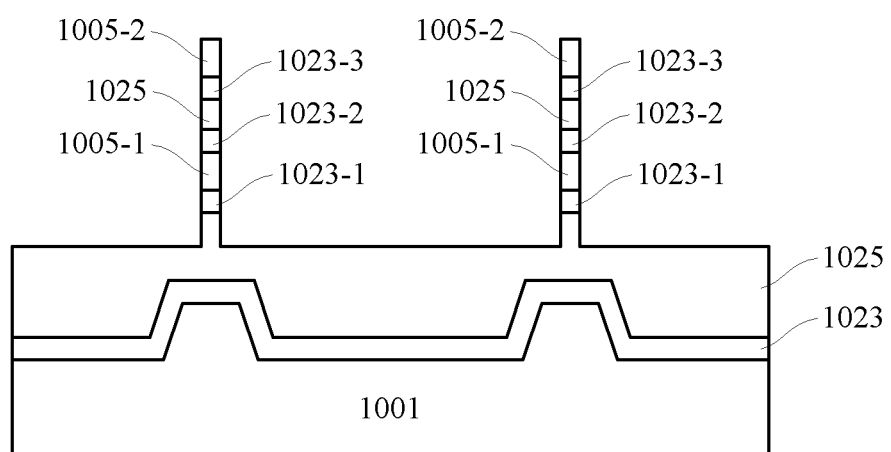

After that, as shown in FIG. 19, the semiconductor layer 1023 may be selectively etched by, for example, RIE, with the nanowires and the mask layer as a mask. Thus, the semiconductor layer 1023 may be remained between the nanowires and the mask layer. Thus, these remaining portions 1023-1, 1023-2, and 1023-3 of the semiconductor layer 1023 may also be in a shape of nanowire. The nanowires 1023-1 and 1023-2, which result from the same semiconductor layer 1023, may be mirror-symmetrical in crystal structure with respect to a central line therebetween.

Figure 20:
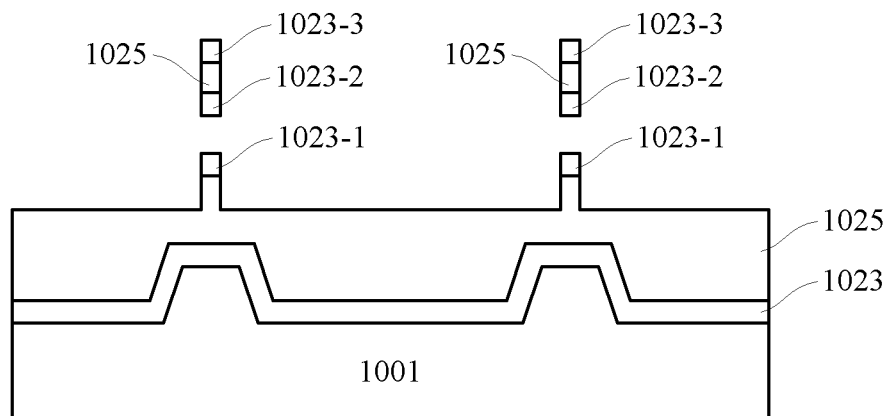
Figure 21:
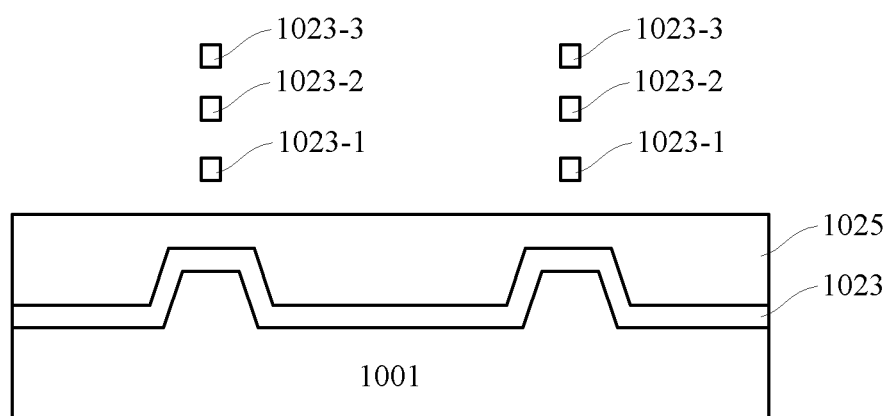

Then, as shown in FIG. 20, the nanowires 1005-1 and 1005-2 may be selectively removed by selective etching such as RIE, and as shown in FIG. 21, the mask layer 1025 may be selectively removed by selective etching such as RIE (for example, wet etching) to obtain suspended nanowires 1023-1, 1023-2, and 1023-3. These nanowires are supported by the supporting portion at the ends or other positions, as described above.

These nanowires 1023-1, 1023-2, and 1023-3 may act as a fin of the device. The device fabrication based on the fin may be performed as described above and will not be described in detail here.

Figure 22:
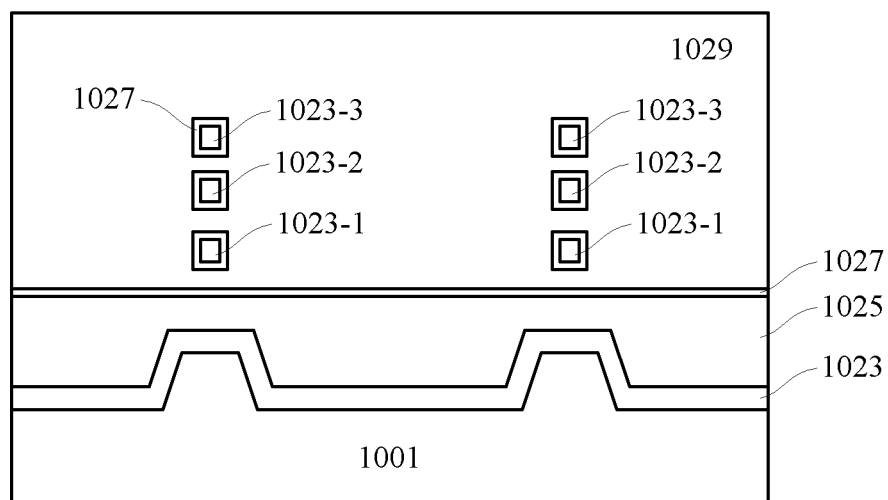

In this way, the semiconductor device according to the present embodiment is obtained. As shown in FIG. 22, the semiconductor device may comprise a plurality of nanowires (1023-1, 1023-2 and 1023-3) spaced apart from the substrate 1001. These nanowires may comprise a material of high mobility to act as a fin of the device. In addition, the device also comprises the isolation layer 1025 and the gate stacks (1027 and 1029) formed on the isolation layer 1025 and intersecting the fin 1023. The gate stacks may at least partially surround the respective fins 1023.

In the above embodiment, the FinFET is described as an example, but the present disclosure is not limited thereto. The technology of the present disclosure can be applied to various semiconductor devices, particularly semiconductor devices which desire to use materials of high mobility such as Ge, SiGe, III-V compound semiconductor materials, or the like, for example, various photoelectric devices such as photodiodes, Laser Diodes (LDs) or the like. For example, a pn junction may be formed by properly doping the semiconductor layer/nanowire which is epitaxially grown on the seed layer to form a diode. Those skilled in the art are aware of various ways to manufacture various semiconductor devices based on the semiconductor layer/nanowire.

The semiconductor devices according to the embodiments of the present disclosure are applicable to various electronic devices. For example, an Integrated Circuit (IC) may be formed by integrating a plurality of such semiconductor devices and other devices (for example, transistors in other forms or the like), from which an electronic device may be made. Therefore, the present disclosure further provides an electronic device comprising the above semiconductor device. The electronic device may also comprise components such as a display operatively coupled to the integrated circuit and a wireless transceiver operatively coupled to the integrated circuit, or the like. Such an electronic device may comprise, for example, a smart phone, a tablet Personal Computer (PC), a Personal Digital Assistant (PDA), or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided only for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

The invention claimed is:

1. A semiconductor device, comprising:
   a substrate;
   one or more nanowires spaced apart from the substrate, wherein the nanowires each extend along a curved longitudinal extending direction; and
   one or more semiconductor layers formed around peripheries of the respective nanowires to at least partially surround the respective nanowires, wherein the respective semiconductor layers around the respective nanowires are spaced apart from each other,
   wherein the curved longitudinal extending direction is in a "C" or "S" shape.

2. The semiconductor device according to claim 1, further comprising:
   an isolation layer formed on the substrate, wherein the respective semiconductor layers are exposed by the isolation layer; and
   a gate stack formed on the isolation layer and intersecting the semiconductor layers, wherein the gate stack comprises gate dielectric layers at least partially surrounding peripheries of the respective semiconductor layers and a gate conductor layer.

3. The semiconductor device according to claim 2, wherein each of the semiconductor layers at least partially surrounding a periphery of a corresponding one of the nanowires is located between the nanowire and the gate stack.

4. The semiconductor device according to claim 2, wherein at least one of the nanowires comprises a first portion and a second portion along the longitudinal extending direction thereof, one of the semiconductor layer formed around the periphery of the nanowire comprises a first portion at least partially surrounding a periphery of the first portion of the nanowire and a second portion at least partially surrounding a periphery of the second portion of the nanowire, and the gate stack comprises a first gate stack intersecting the first portion of the semiconductor layer and a second gate stack intersecting the second portion of the semiconductor layer.

5. The semiconductor device according to claim 2, further comprising: another semiconductor layer formed on a surface of the substrate and comprising the same material as that of the semiconductor layers, wherein the isolation layer is formed on the other semiconductor layer.

6. The semiconductor device according to claim 2, further comprising: a gate dielectric layer and a work function adjustment layer in sequence formed on a surface of the isolation layer, wherein the gate conductor is formed on the gate dielectric layer and the work function adjustment layer on the surface of the isolation layer.

7. The semiconductor device according to claim 1, wherein there are a plurality of nanowires arranged in a direction substantially perpendicular to a surface of the substrate, and the nanowires are spaced apart from each other and extend substantially in parallel to each other.

8. The semiconductor device according to claim 1, wherein at least one of the nanowires comprises a first portion and a second portion along the longitudinal extending direction thereof, and one of the semiconductor layers formed around the periphery of the nanowire comprises a first portion at least partially surrounding a periphery of the first portion of the nanowire and a second portion at least partially surrounding a periphery of the second portion of the nanowire.

9. The semiconductor device according to claim 8, further comprising: a dielectric layer extending in a direction intersecting the longitudinal extending direction of the nanowire, wherein the dielectric layer isolates the first portion of the nanowire from the second portion of the nanowire and isolates the first portion of the semiconductor layer from the second portion of the semiconductor layer.

10. The semiconductor device according to claim 1, wherein the nanowires comprise Si and the semiconductor layers comprise Ge, SiGe, or a III-V compound semiconductor.

11. The semiconductor device according to claim 1, further comprising a supporting portion through which the respective nanowires are physically connected to the substrate.

12. The semiconductor device according to claim 11, wherein each of the nanowires has a portion connected to the supporting portion, which portion has an extent, in the longitudinal extending direction of the nanowire, less than a length of the nanowire in the longitudinal extending direction.

13. The semiconductor device according to claim 12, wherein the supporting portion comprises a laterally extending portion extending along the surface of the substrate and a vertically extending portion extending in a direction substantially perpendicular to the surface of the substrate, wherein the vertically extending portion extends onto vertical sidewalls of the respective nanowires along the direction substantially perpendicular to the surface of the substrate.

14. The semiconductor device according to claim 12, wherein
   the substrate comprises a protrusion at a position corresponding to the nanowires, and the vertically extending portion of the supporting portion has a part thereof extending along a surface of the protrusion, and a further part thereof extending along the vertical sidewalls of the respective nanowires.

15. The semiconductor device according to claim 11, wherein the supporting portion is positioned at opposite ends of the nanowires.

16. An electronic device, comprising an integrated circuit comprising the semiconductor device according to claim 1.

17. The electronic device according to claim 16, further comprising a display operatively coupled to the integrated circuit and a wireless transceiver operatively coupled to the integrated circuit.

18. A semiconductor device, comprising:
a substrate; and
at least two nanowires spaced apart from the substrate, wherein the nanowires are arranged in a direction substantially perpendicular to a surface of the substrate, and the respective nanowires are spaced apart from one another and extend along a curved longitudinal extending direction substantially in parallel to each other, wherein at least one pair of adjacent ones of the nanowires are mirror-symmetrical in crystal structure with respect to a central line therebetween,
wherein the curved longitudinal direction is in a "C" or "S" shape.

19. The semiconductor device according to claim 18, further comprising:
an isolation layer formed on the substrate, wherein the respective nanowires are exposed by the isolation layer; and
a gate stack formed on the isolation layer and intersecting the nanowires, wherein the gate stack comprises gate dielectric layers at least partially surrounding peripheries of the respective nanowires and a gate conductor layer.

20. The semiconductor device according to claim 19, wherein at least one of the nanowires comprises a first portion and a second portion along the longitudinal extending direction thereof, and the gate stack comprises a first gate stack intersecting the first portion of the nanowire and a second gate stack intersecting the second portion of the nanowire.

21. The semiconductor device according to claim 18, wherein at least one of the nanowires comprises a first portion and a second portion along the longitudinal extending direction thereof.

22. The semiconductor device according to claim 21, further comprising: a dielectric layer extending in a direction intersecting the longitudinal extending direction of the nanowires, wherein the dielectric layer isolates the first portion of the nanowire from the second portion of the nanowire.

23. The semiconductor device according to claim 19, further comprising a semiconductor layer formed on the surface of the substrate and comprising the same material as that of the nanowires, wherein the isolation layer is formed on the semiconductor layer.

24. The semiconductor device according to claim 19, wherein the substrate comprises Si and the nanowires comprise Ge, SiGe, or a III-V compound semiconductor.

25. The semiconductor device according to claim 19, wherein the surface of the substrate is a (111) or (110) crystal plane.

* * * * *